(12) United States Patent
Hama et al.

(10) Patent No.: US 10,297,496 B2
(45) Date of Patent: May 21, 2019

(54) METHOD FOR PROCESSING TARGET OBJECTION

(71) Applicant: TOKYO ELECTRON LIMITED, Tokyo (JP)

(72) Inventors: Yasutaka Hama, Miyagi (JP); Seiji Yokoyama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/920,607

(22) Filed: Mar. 14, 2018

(65) Prior Publication Data

US 2018/0269101 A1 Sep. 20, 2018

(30) Foreign Application Priority Data

Mar. 15, 2017 (JP) .................................. 2017-050009
Nov. 16, 2017 (JP) .................................. 2017-221026

(51) Int. Cl.
*H01L 21/02* (2006.01)
*H01L 21/027* (2006.01)
(Continued)

(52) U.S. Cl.
CPC .... *H01L 21/76831* (2013.01); *H01L 21/0276* (2013.01); *H01L 21/31116* (2013.01);
(Continued)

(58) Field of Classification Search
CPC ........... H01L 21/76831; H01L 21/0276; H01L 21/31116; H01L 21/31144; H01L 21/76802; H01L 21/76877; H01L 21/02164; H01L 21/02167; H01L 21/0217; H01L 21/02175; H01L 21/31111
See application file for complete search history.

(56) References Cited

U.S. PATENT DOCUMENTS

2005/0112879 A1* 5/2005 Fujimoto .......... H01L 21/31116
438/689
2010/0240220 A1* 9/2010 Chiu ....................... G03F 7/427
438/714

(Continued)

FOREIGN PATENT DOCUMENTS

JP 2006-156486 A 6/2006
JP 2012-124351 A 6/2012

*Primary Examiner* — Anita K Alanko
(74) *Attorney, Agent, or Firm* — Rothwell, Figg, Ernst & Manbeck, P.C.

(57) ABSTRACT

In a method for processing a target object including a conductive layer and an insulating film formed on the conductive layer, the insulating film is etched by plasma treatment of a fluorine-containing gas to form an opening in the insulating film. A barrier film is formed to cover a surface of the insulating film and a surface of the conductive layer which is exposed through the opening formed in the insulating film. The target object having the barrier film is placed in an atmospheric environment, and the barrier film is removed from the target object by isotropically etching the barrier film. The target object is maintained in a depressurized environment from start of etching the insulating film to end of forming the barrier film. The barrier film is conformally formed on the surfaces of the insulating film and the conductive layer exposed through the opening formed in the insulating film.

15 Claims, 14 Drawing Sheets

(51) Int. Cl.
*H01L 21/768* (2006.01)
*H01L 21/311* (2006.01)

(52) U.S. Cl.
CPC .. *H01L 21/31144* (2013.01); *H01L 21/76802* (2013.01); *H01L 21/76877* (2013.01); *H01L 21/0217* (2013.01); *H01L 21/02164* (2013.01); *H01L 21/02167* (2013.01); *H01L 21/02175* (2013.01); *H01L 21/31111* (2013.01)

(56) References Cited

U.S. PATENT DOCUMENTS

| | | |
|---|---|---|
| 2012/0149195 A1 | 6/2012 | Kuniya |
| 2015/0126027 A1* | 5/2015 | Matsumoto ....... H01L 23/53238 438/652 |
| 2017/0092536 A1* | 3/2017 | Yang ................ H01L 21/76855 |

* cited by examiner

METHOD FOR PROCESSING TARGET OBJECTION

CROSS-REFERENCE TO RELATED APPLICATIONS

This application claims priority to Japanese Patent Application Nos. 2017-050009 and 2017-221026 respectively filed on Mar. 15, 2017 and Nov. 16, 2017, the entire contents of which are incorporated herein by reference.

FIELD OF THE INVENTION

The present disclosure relates to a method for processing a target object.

BACKGROUND OF THE INVENTION

In manufacturing electronic devices such as semiconductor devices, plasma etching may be performed to form an opening in an insulating film formed on a metal-containing conductive layer. When the plasma etching is performed, the insulating film is etched by plasma treatment with a gas containing fluorine. After the plasma etching is performed, a residue containing fluorine is generated on a surface of the conductive layer, which is exposed through the opening formed in the insulating film. If a target object is placed in an atmospheric environment after the plasma etching, the surface of the conductive layer is corroded. Since a hydrate is generated by reaction among a metal, fluorine and moisture in the air when the surface of the conductive layer is corroded, the corrosion of the surface of the conductive layer needs to be suppressed.

Japanese Patent Application Publication No. 2006-156486 discloses a technique for removing the residue on the surface of the conductive layer by plasma treatment with a gas containing nitrogen and hydrogen. However, it is difficult to completely remove the residue by the plasma treatment.

Japanese Patent Application Publication No. 2012-124351 discloses a technique for forming a silicon oxide film by a chemical vapor deposition (CVD) method to cover a surface of an insulating film and a surface of a conductive layer after the plasma etching is performed on the insulating film and before the target object is placed in an atmospheric environment.

Due to the presence of the silicon oxide film, even when the target object is placed in the atmospheric environment, the surface of the conductive layer and the residue are prevented from being in contact with the atmosphere. The silicon oxide film is removed in a subsequent step after the target object is placed in the atmospheric environment. The silicon oxide film is removed by wet etching. However, when the silicon oxide film is removed, the insulating film is partially considerably etched.

Therefore, after the insulating film is etched and before the target object is placed in the atmospheric environment, the surface of the insulating film and the surface of the conductive layer need to be covered with a barrier film. It is also necessary to suppress the partial etching of the insulating film when removing the barrier film, which is performed after the target object is placed in the atmospheric environment.

SUMMARY OF THE INVENTION

In accordance with an aspect, there is provided a method for processing a target object including a conductive layer and an insulating film formed on the conductive layer. The method includes: (i) a step of etching the insulating film by plasma treatment with a fluorine-containing gas to form an opening in the insulating film; (ii) a step of forming a barrier film to cover a surface of the insulating film and a surface of the conductive layer which is exposed through the opening formed in the insulating film; (iii) a step of placing the target object having the barrier film in an atmospheric environment; and (iv) a step of removing the barrier film from the target object by isotropically etching the barrier film. In the method, the target object is maintained in a depressurized environment from start of said etching the insulating film to end of said forming the barrier film. The barrier film is conformally formed on the surface of the insulating film and on the surface of the conductive layer exposed through the opening formed in the insulating film.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
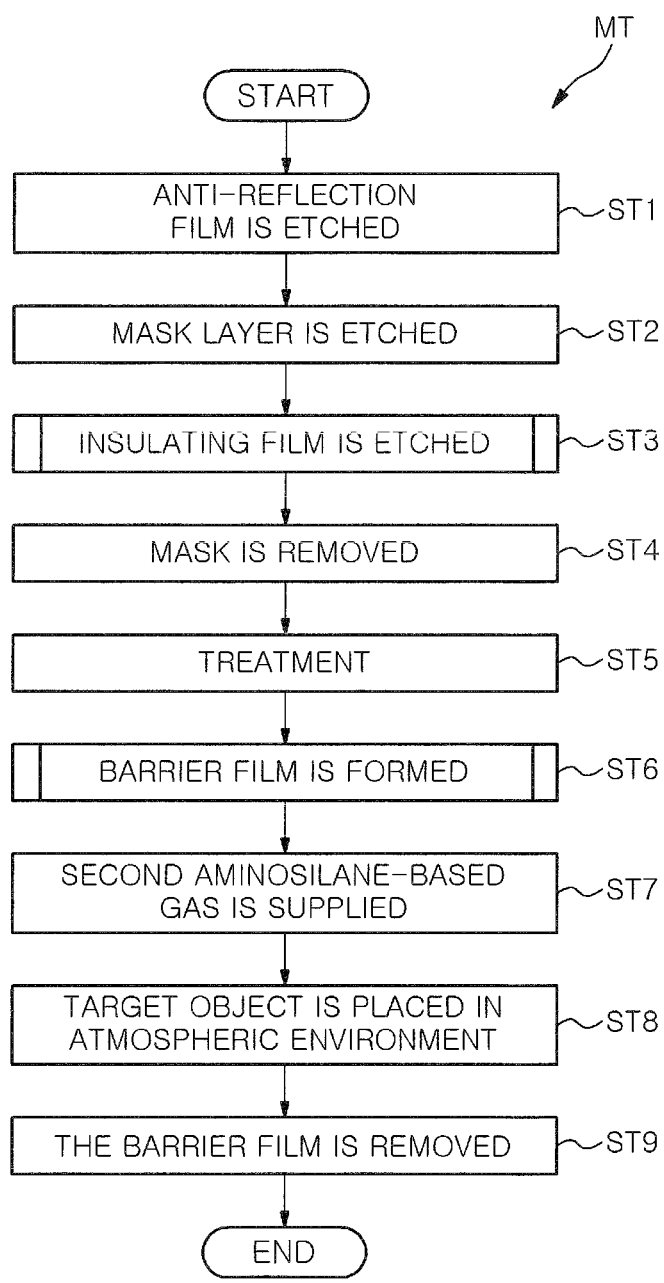
FIG. 1 is a flowchart showing a method for processing a target object according to an embodiment.

Hereinafter, embodiments will be described in detail with reference to the accompanying drawings. Like reference numerals will be given to like or corresponding parts throughout the drawings.

Figure 2:
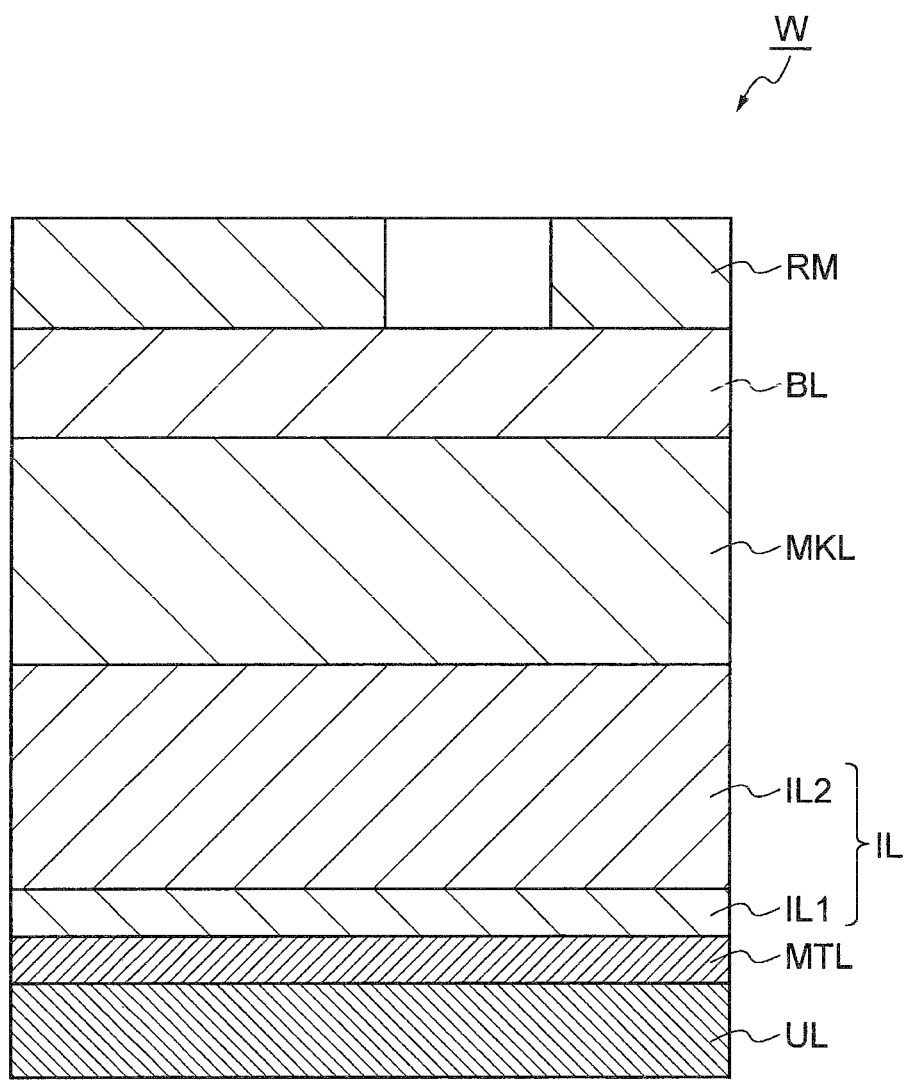
FIG. 2 is an enlarged cross sectional view showing a part of a target object.

FIG. 1 is a flowchart showing a method for processing a target object according to an embodiment. A method MT shown in FIG. 1 is applied to a target object having a conductive layer and an insulating film formed on the conductive layer. FIG. 2 is an enlarged cross sectional view showing a part of a target object. The target object W includes a metal layer MTL and an insulating film IL. The metal layer MTL is an example of the conductive layer. The target object W shown in FIG. 2 further includes a base layer UL, a mask layer MKL, an anti-reflection film BL and a resist mask RM.

The metal layer MTL is formed on the base layer UL. Although it is not necessary, the base layer UL may include a silicon layer and a titanium nitride layer in that order from the bottom. The metal layer MTL is made of a metal. The metal layer MTL is, e.g., a layer constituting a wiring layer in a semiconductor device and may be made of any wiring metal material. The metal layer MTL is made of, e.g., cobalt or copper.

The insulating film IL is formed on the metal layer MTL. In one example, the insulating film IL is a multilayer film and may include a first layer IL1 and a second layer IL2. The first layer IL1 is, e.g., a diffusion barrier film, and made of silicon nitride. The second layer IL2 is, e.g., an interlayer insulating film and made of silicon oxide.

The mask layer MKL is formed on the insulating film IL. The mask layer MKL is used as a mask for etching the insulating film IL. The mask layer MKL is made of, e.g., amorphous. carbon. The anti-reflection film BL is formed on the mask layer MKL. The anti-reflection film BL is, e.g., an anti-reflection film containing silicon. The resist mask RM is formed on the anti-reflection film BL. One or more openings are formed in the resist mask RM. A pattern of the resist mask RM is formed by a photolithography technique.

Figure 3:
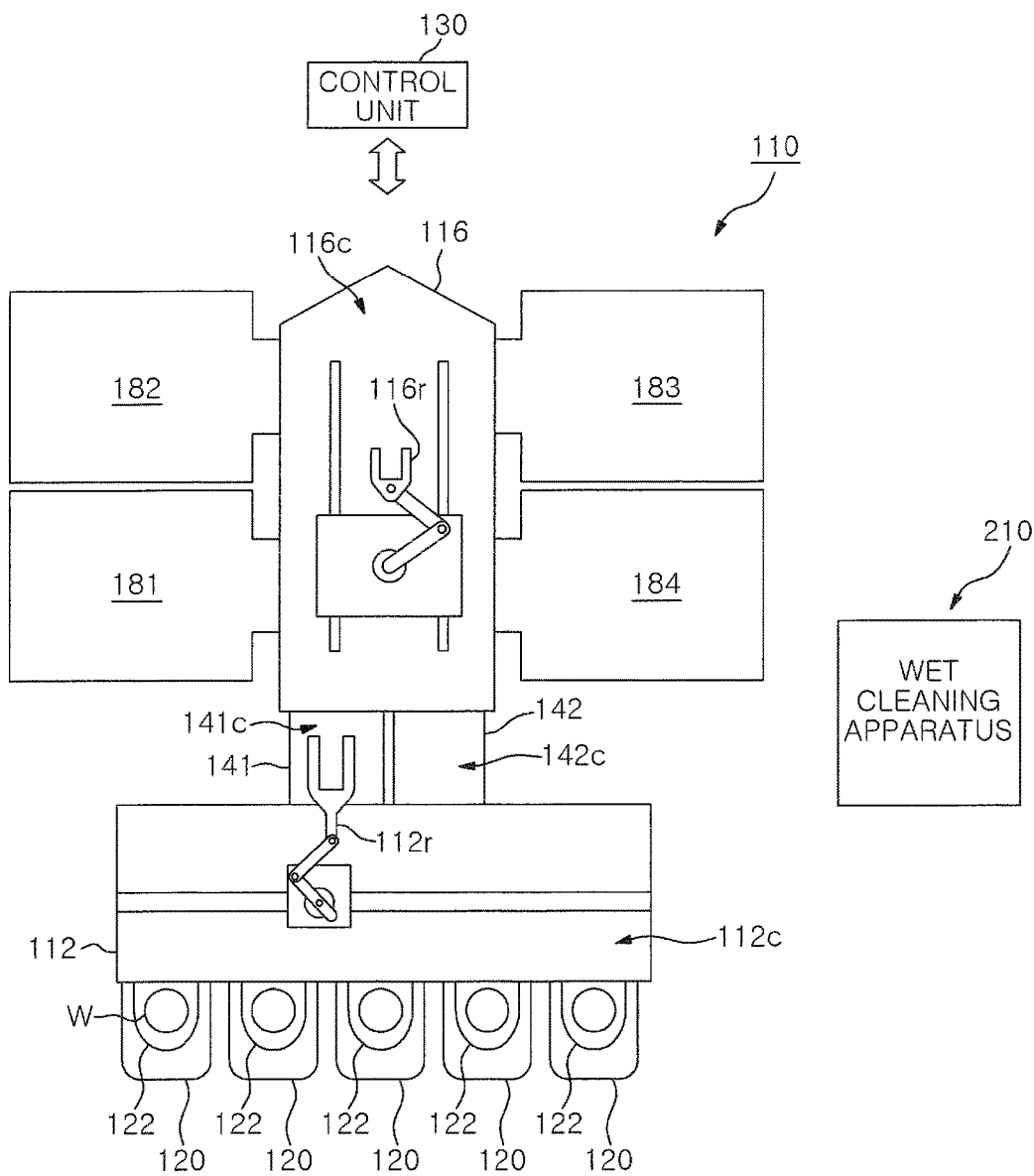
FIG. 3 shows a processing system and a wet cleaning apparatus that can be used to perform the method according to the embodiment.

The method MT can be performed by using a processing system including a plasma processing apparatus and a wet cleaning apparatus. FIG. 3 shows the processing system and the wet cleaning apparatus which can be used for performing a method according to an embodiment. The processing system 110 shown in FIG. 3 includes a loader module 112, a load-lock module 141, a load-lock module 142, a transfer module 116, a plurality of process modules 181 to 184, and a control unit 130.

The loader module 112 transfers the target object W under an atmospheric pressure environment. A plurality of tables 120 is attached to the loader module 112. A container 122 capable of accommodating a plurality of target objects is mounted on each of the tables 120. The container 122 may be, e.g., a Front Opening Unified Pod (FOUP). The container 122 is configured to accommodate therein the target objects W.

The loader module 112 has therein a transfer chamber 112c. The loader module 112 has a transfer robot 112r. The transfer robot 112r is provided in the transfer chamber 112c. The load-lock modules 141 and 142 are connected to the loader module 112. The transfer robot 112r is configured to transfer the target object W between the container 122 and the load-lock module 141 or 142.

The load-lock modules 141 and 142 provide preliminary depressurized chambers 141c and 142c, respectively. A transfer module 116 is connected to the load-lock modules 141 and 142. The transfer module 116 provides a depressurizable transfer chamber 116c. The transfer module 116 has a transfer robot 116r. The transfer robot 116r is provided in the transfer chamber 116c. The process modules 181 to 184 are connected to the transfer module 116. The transfer robot 116r of the transfer module 116 can transfer the target object W between any one of the load-lock modules 141 and 142 and any one of the process modules 181 to 184 and between any two of the process modules 181 to 184.

Each of the process modules 181 to 184 serves as a substrate processing apparatus. One of the process modules 181 to 184 is the plasma processing apparatus 10 shown in FIG. 4.

The control unit 130 is configured to control the respective units of the processing system 110 and the respective units of the process modules. The control unit 130 is, e.g., a computer device, and includes a processor, a storage device and an input device such as a keyboard, a display device, and a signal input/output interface. In the storage device, a control program and recipe data for executing the method MT are stored. The processor sends control signals to the respective units of the processing system 110 and the respective units of the process modules based on the control program and the recipe data.

The wet cleaning apparatus 210 is used for removal of the barrier film in the method MT. The wet cleaning apparatus 210 is configured to perform wet etching for removing the barrier film on the target object accommodated therein.

Figure 4:
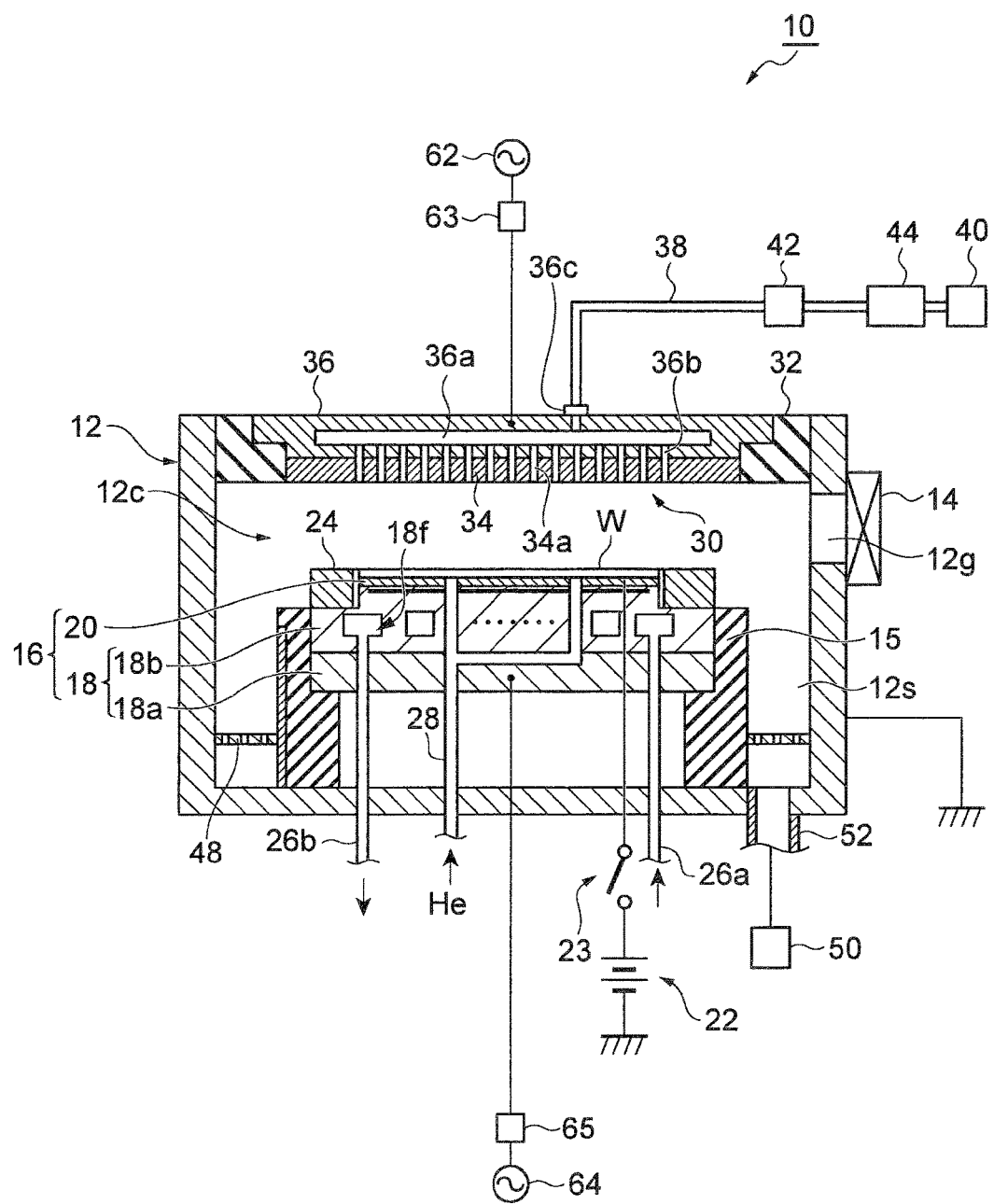
FIG. 4 schematically shows a plasma processing apparatus that can be used to perform the method shown in FIG. 1.

Hereinafter, the plasma processing apparatus 10 will be described. FIG. 4 schematically shows the plasma processing apparatus that can be used for performing the method shown in FIG. 1. The plasma processing apparatus 10 shown in FIG. 4 is a capacitively coupled plasma processing apparatus. The plasma processing apparatus 10 includes a chamber main body 12. The chamber main body 12 has a substantially cylindrical shape. The chamber main body 12 defines a chamber 12c that is an inner space thereof. A film having plasma resistance is formed on an inner wall surface of the chamber main body 12. This film may be a film formed by anodic oxidation treatment or a film made of yttrium oxide. The chamber main body 12 is grounded. An opening 12g is formed at a sidewall of the chamber main body 12. The target object W passes through the opening 12g when the target object W is loaded into the chamber 12c from the outside of the chamber main body 12 and unloaded from the chamber 12c to the outside of the chamber main body 12. A gate valve 14 is provided at the sidewall of the chamber main body 12. The gate valve 14 is configured to open and close the opening 12g.

A supporting member 15 is provided on a bottom portion of the chamber main body 12. The supporting member 15 is formed in, e.g., a substantially cylindrical shape, and made of an insulating material. The supporting member 15 extends upward from the bottom portion of the chamber main body 12 inside the chamber main body 12. A stage 16 is provided in the chamber 12c. The stage 16 is supported by the supporting member 15.

The stage 16 is configured to support the target object W mounted thereon. The stage 16 includes a lower electrode 18 and an electrostatic chuck 20. The lower electrode 18 has a first plate 18a and a second plate 18b. Each of the first plate 18a and the second plate 18b is made of a metal, e.g., aluminum, and has a substantially disc shape. The second plate 18b is provided on the first plate 18a and electrically connected to the first plate 18a.

The electrostatic chuck 20 is provided on the second plate 18b. The electrostatic chuck 20 has an insulating layer and an electrode that is a conductive film provided in the insulating layer. A DC power supply 22 is electrically connected to the electrode of the electrostatic chuck 20 via a switch 23. The electrostatic chuck 20 attracts and holds the target object W thereon by an electrostatic force generated by a DC voltage applied from the DC power supply 22.

A focus ring 24 is disposed on a peripheral portion of the second plate 18b to surround an edge of the target object W and the electrostatic chuck 20. The focus ring 24 is provided to improve uniformity of the plasma treatment for the target object W. The focus ring 24 is made of a material that is appropriately selected depending on types of plasma treatment.

A flow path 18f is formed in the second plate 18b. A coolant is supplied to the flow path 18f from a chiller unit provided outside the chamber main body 12 through a line 26a. The coolant supplied to the flow path 18f returns to the chiller unit through a line 26b. A temperature of the target object W held on the electrostatic chuck 20 is controlled by the circulation of the coolant between the flow path 18f and the chiller unit.

The plasma processing apparatus 10 is provided with a gas supply line 28. The gas supply line 28 supplies a heat transfer gas, e.g., He gas, from a heat transfer gas supply unit (not shown) to a gap between an upper surface of the electrostatic chuck 20 and a backside of the target object W.

The plasma processing apparatus 10 further includes an upper electrode 30. The upper electrode 30 is provided above the stage 16. The upper electrode 30 is supported at the upper portion of the chamber main body 12 through a member 32. The upper electrode 30 may include a top plate 34 and a holding body 36. The top plate 34 faces the chamber 12c. A plurality of gas injection holes 34a is formed in the top plate 34. The top plate 34 is made of, e.g., silicon. Alternatively, the top plate 34 may be a member made of aluminum having a plasma-resistant film formed on a surface thereof.

The holding body 36 is configured to detachably hold the top plate 34. The holding body 36 is made of a conductive material, e.g., aluminum. A gas diffusion space 36a is formed in the holding body 36. A plurality of gas holes 36b communicating with the gas injection holes 34a extends downward from the gas diffusion space 36a. A gas inlet port 36c for guiding a processing gas to the gas diffusion space 36a is formed in the holding body 36. A gas supply line 38 is connected to the gas inlet port 36c.

A gas source group 40 is connected to the gas supply line 38 via a valve group 42 and a flow rate controller group 44. The gas source group 40 includes a plurality of gas sources. In one example, the gas source group 40 includes one or more sources of fluorine-containing gas, a source of $N_2$ gas, a source of $H_2$ gas, a source of a rare gas, a source of a precursor gas, a source of an aminosilane-based gas having an alkylsilane group, and a source of an oxygen-containing gas. The gas source group 40 may further include a source of a nitrogen-containing gas (e.g., $NH_3$ gas) or a source of a hydrocarbon gas (e.g., $CH_4$ gas, $C_2H_4$ gas, or $C_3H_8$ gas).

One or more sources of fluorine-containing gas may include one or more sources among a source of a fluorocarbon gas, a source of a hydrofluorocarbon gas, and a source of $NF_3$ gas. The source of a fluorocarbon gas includes one or more gas sources, e.g., a source of $CF_4$ gas and a source of $C_4F_6$ gas. The source of a hydrofluorocarbon gas is, e.g., a source of $CH_3F$ gas. The source of a rare gas may be a source of any rare gas such as He gas, Ne gas, Ar gas, Kr gas and Xe gas. The source of an oxygen-containing gas may be a source of oxygen ($O_2$) gas, CO gas, or $CO_2$ gas.

The source of a precursor gas is used in a step ST6 to be described later. The source of a precursor gas may be a source of a silicon-containing gas or a source of a metal-containing gas. In one embodiment, the precursor gas does not contain a halogen element. The silicon-containing gas used as the precursor gas may be, e.g., an aminosilane-based gas (hereinafter, referred to as "first aminosilane-based gas"). The first aminosilane-based gas may be any aminosilane-based gas. As for the first aminosilane-based gas, monoamino silane R being an amino group that contains an organic group and that may be substituted) may be used, for example. The first aminosilane-based gas may include aminosilane having 1 to 3 silicon atoms and may include aminosilane having 1 to 3 amino groups. The aminosilane having 1 to 3 silicon atoms may be monosilane having 1 to 3 amino groups, disilane having 1 to 3 amino groups, or trisilane having 1 to 3 amino groups. Further, the aminosilane may have an amino group that may be substituted. The first aminosilane-based gas may be BTBAS (Bistertiaybutylaminosilane), BDMAS (Bisdimethylaminosilane), BDEAS (Bisdiethylaminosilane), DMAS (dimethylaminosilane), DEAS (diethylaminosilane), DPAS (Dipropylaminosilane), BAS (Butylaminosilane), BEMAS (Bisethylmethylaminosilane), or TDMAS (Tridimethylaminosilane). The silicon-containing gas used as the precursor gas may be silicon alkoxide-based gas represented by TEOS (tetraethoxysilane), for example. The metal-containing gas used as the precursor gas may be trimethylaluminum gas.

A source of an aminosilane-based gas having an alkylsilane group (hereinafter, referred to as "second aminosilane-based gas") may be HDMS (hexamethyldisilazane), DMS-DMA (dimethylsilyldimethylamine), TMSDMA (Dimethilaminotriimethylsilane), TMMAS (trimethylmethylaminosilane), TMICS (trimethylisocyanatosilane), TMSA (trimethylsilylacetylene), or TMSC (trimethylsilylcyanide).

The valve group 42 includes a plurality of valves. The flow rate control group 44 includes a plurality of flow rate controllers such as mass flow controllers. The gas sources of the gas source group 40 are connected to the gas supply line 38 via corresponding valves of the valve group 42 and corresponding flow rate controllers of the flow rate control group 44, respectively.

At a lower portion in the chamber main body 12, a baffle plate 48 is provided between the supporting member 15 and the sidewall of the chamber main body 12. A plurality of through-holes is formed in the baffle plate 48 to extend therethrough in a plate thickness direction thereof. The baffle plate 48 can be formed by coating an aluminum plate with ceramics such as $Y_2O_3$ or the like. A gas exhaust line 52 is connected to the chamber main body 12 below the baffle plate 48. A gas exhaust unit 50 is connected to the gas exhaust line 52. The gas exhaust unit 50 has a pressure controller such as a pressure control valve and a vacuum pump such as a turbo molecular pump. The gas exhaust unit 50 is configured to reduce a pressure in the chamber 12c to a specified level.

The plasma processing apparatus 10 further includes a first high frequency power supply 62 and a second high frequency power supply 64. The first high frequency power supply 62 generates a first high frequency power for plasma generation. The first high frequency power has a frequency of 27 MHz to 100 MHz, for example. The first high frequency power supply 62 is connected to the upper electrode 30 via a matching unit 63. The matching unit 63 has a circuit for matching an output impedance of the first high frequency power supply 62 and a load impedance. The first high frequency power supply 62 may be connected to the lower electrode 18 via the matching unit 63.

The second high frequency power supply 64 generates a second high frequency power for attracting ions to the target object W. In other words, the second high frequency power supply 64 generates a second high frequency power for bias. The second high frequency power has a frequency ranging from 400 kHz to 13.56 MHz, for example. The second high frequency power supply 64 is connected to the lower electrode 18 via a matching unit 65. The matching unit 65 has a circuit for matching an output impedance of the second high frequency power supply 64 and a load impedance.

The method MT will be described with reference to FIG. 1 again. Hereinafter, the case of performing the method MT by using the processing system 110 and the wet cleaning apparatus 210 and executing steps ST1 to ST7 of the method MT by using the plasma processing apparatus 10 will be described. It is not necessary to perform the method MT by using the processing system 110 and the wet cleaning apparatus 210. The steps ST1 to ST7 of the method MT may be executed by using one or more substrate processing apparatuses including the plasma processing apparatus 10 or one or more substrate processing apparatuses other than the plasma processing apparatus 10.

Figure 5:
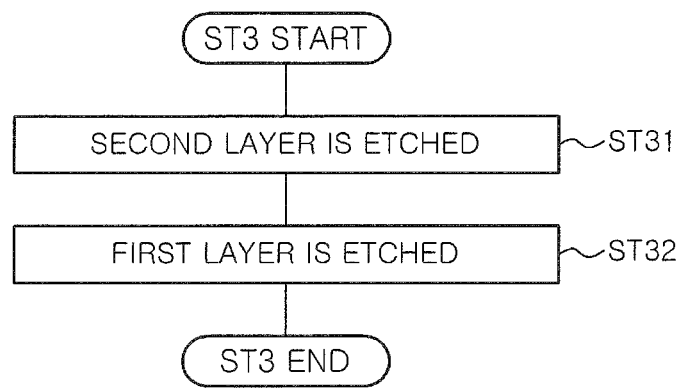
FIG. 5 is a flowchart showing a step ST3 of the method shown in FIG. 1.
Figure 6:
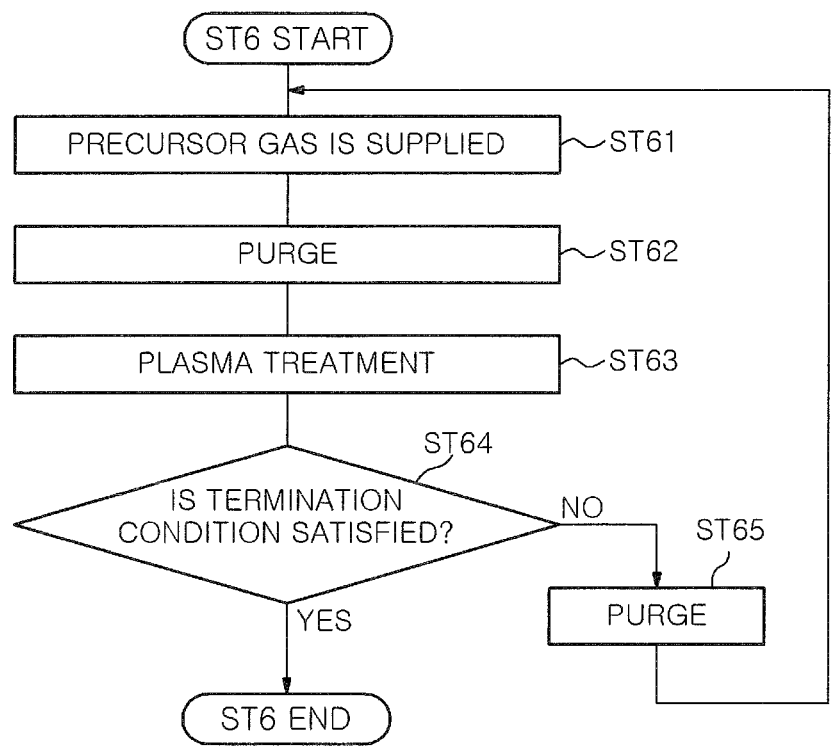
FIG. 6 is a flowchart showing a step ST6 of the method shown in FIG. 1.
Figure 12:
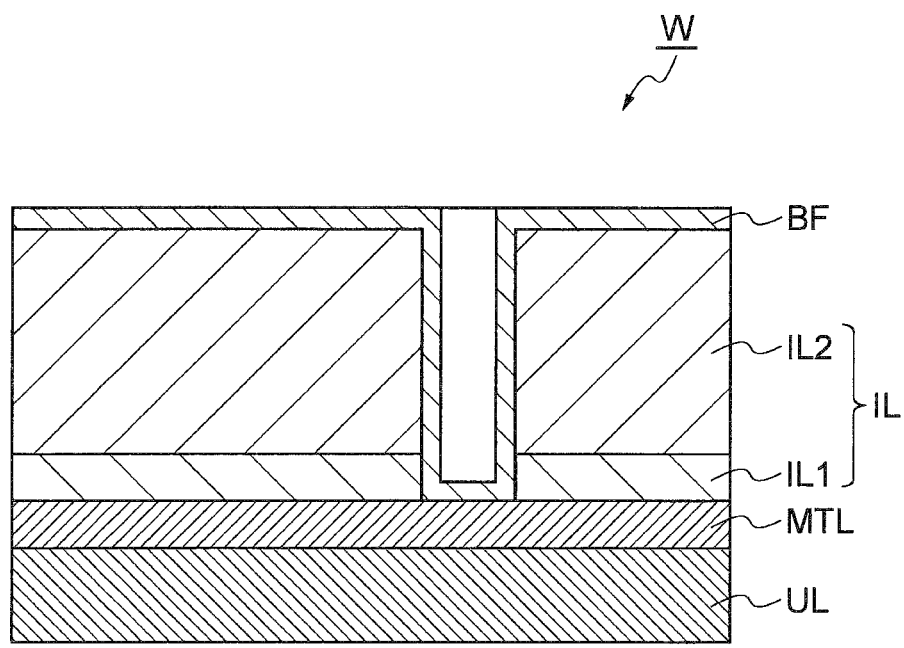
Figure 13:
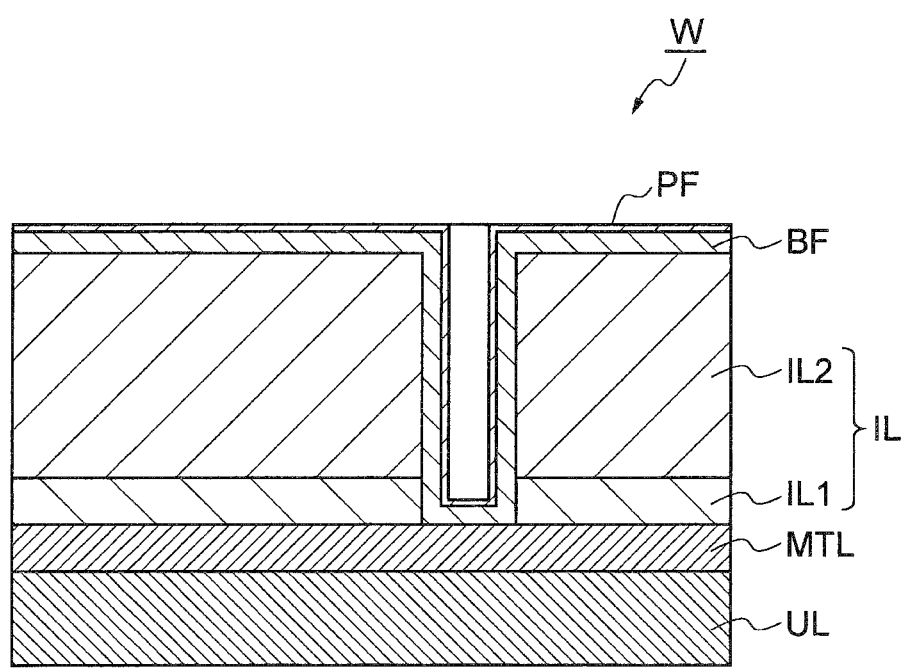
Figure 14:
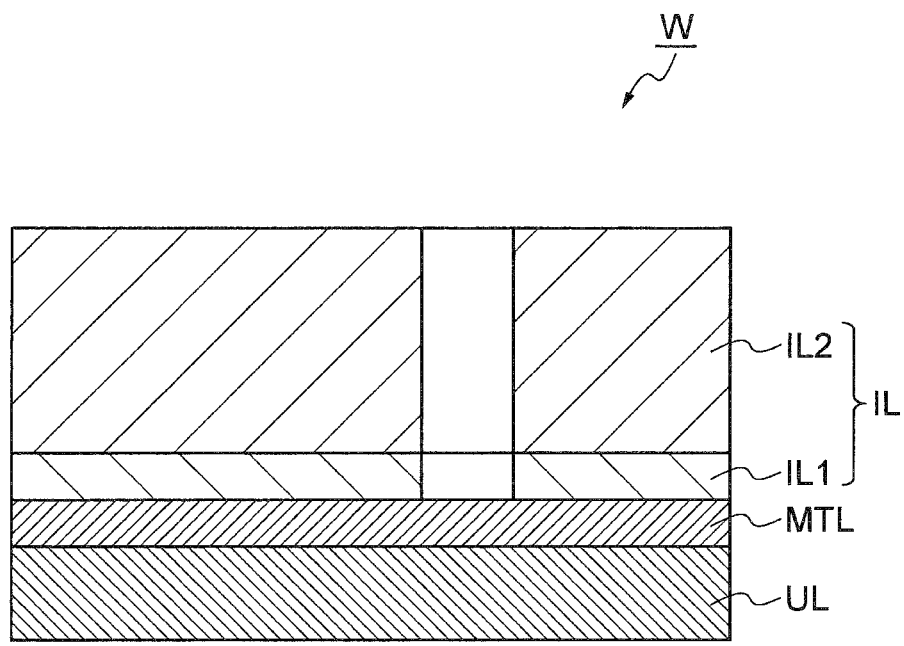
FIG. 14 is an enlarged cross sectional view showing a part of the target object obtained after completion of the method shown in FIG. 1.

FIGS. 5 to 14 will be referred to together with FIG. 1. FIG. 5 is a flowchart showing a step ST3 of the method shown in FIG. 1. FIG. 6 is a flowchart showing a step ST6 of the method shown in FIG. 1. FIGS. 7 to 13 are enlarged cross sectional views showing a part of a target object obtained during the method shown in FIG. 1. FIG. 14 is an enlarged cross sectional view showing a part of the target object obtained after the completion of the method shown in FIG. 1.

As shown in FIG. 1, in one embodiment, the step ST1 of the method MT is started. In the step ST1, the anti-reflection film BL is etched. The anti-reflection film BL is etched by plasma etching. In the case of using the plasma processing apparatus 10, in the step ST1, the target object W shown in FIG. 2 is mounted on the electrostatic chuck 20 of the stage 16 and held by the electrostatic chuck 20. Then, a gas for etching the anti-reflection film BL is supplied to the chamber 12c from one or more gas sources selected among the plurality of gas sources. In the step ST1, the gas supplied to the chamber 12c may be a fluorocarbon gas. Further, in the step ST1, a pressure in the chamber 12c is reduced by the gas exhaust unit 50. Further, in the step ST1, the first high frequency power from the first high frequency power supply 62 is supplied to the upper electrode 30, and the second high frequency power from the second high frequency power supply 64 is supplied to the lower electrode 18.

Figure 7:
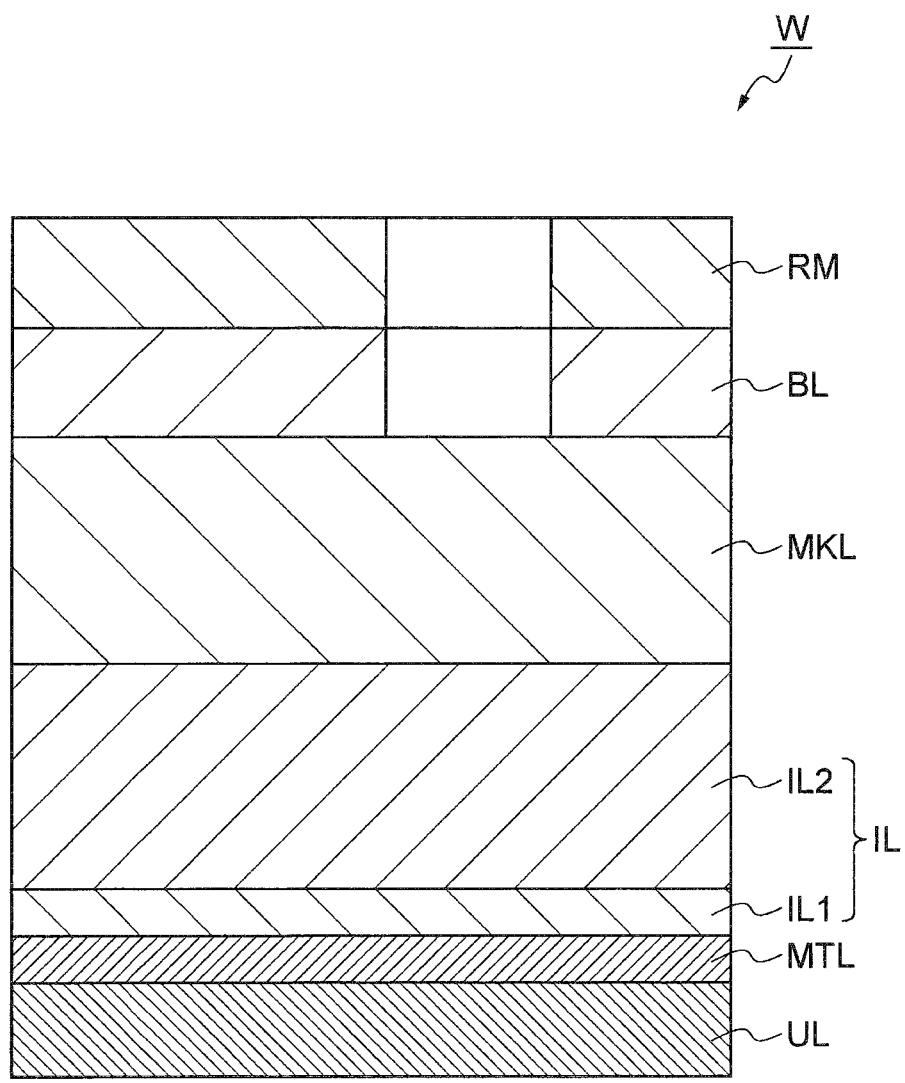
FIGS. 7 to 13 are enlarged cross sectional views showing a part of the target object obtained during the method shown in FIG. 1.

In the step ST1, a plasma of the gas supplied to the chamber 12c is generated, and the anti-reflection film BL is etched by active species such as ions and/or radicals in the plasma. By performing the step ST1, a pattern of the resist mask RM is transferred to the anti-reflection film BL as shown in FIG. 7, and an opening communicating with the opening of the resist mask RM is formed in the anti-reflection film BL.

Next, as shown in FIG. 1, a step ST2 of the method MT according to the embodiment is executed. In the step ST2, the mask layer MKL of the target object W shown in FIG. 7 is etched. The etching of the mask layer MKL is plasma etching. In the case of using the plasma processing apparatus 10, in the step ST2, the target object W shown in FIG. 7 is mounted on the electrostatic chuck 20 of the stage 16 and held by the electrostatic chuck 20. In the step ST2, a gas for etching the mask layer MKL is supplied to the chamber 12c from one or more gas sources selected among the plurality of gas sources. In the step ST2, the gas supplied to the chamber 12c is, e.g., a mixture gas of $N_2$ gas and $H_2$ gas. Further, in the step ST2, a pressure in the chamber 12c is reduced by the gas exhaust unit 50. Moreover, in the step ST2, the first high frequency power from the first high frequency power supply 62 is supplied to the upper electrode 30, and the second high frequency power from the second high frequency power supply 64 is supplied to the lower electrode 18.

In the step ST2, a plasma of the gas supplied to the chamber 12c is generated, and the mask layer MKL is etched by active species such as ions and/or radicals in the plasma. By executing the step ST2, a pattern of the anti-reflection film BL is transferred to the mask layer MKL, and an opening communicating with the opening of the anti-reflection film BL is formed in the mask layer MKL. Accordingly, a mask MK can be obtained from the mask layer MKL.

Next, as shown in FIG. 1, a step ST3 of method MT according to the embodiment is executed. In the step ST3, the insulating film IL is etched by plasma treatment using a fluorine-containing gas. In one example, the insulating film IL includes a first layer IL1 and a second layer IL2, and the step ST3 includes a step ST31 and a step ST32 as shown in FIG. 5.

Figure 8:
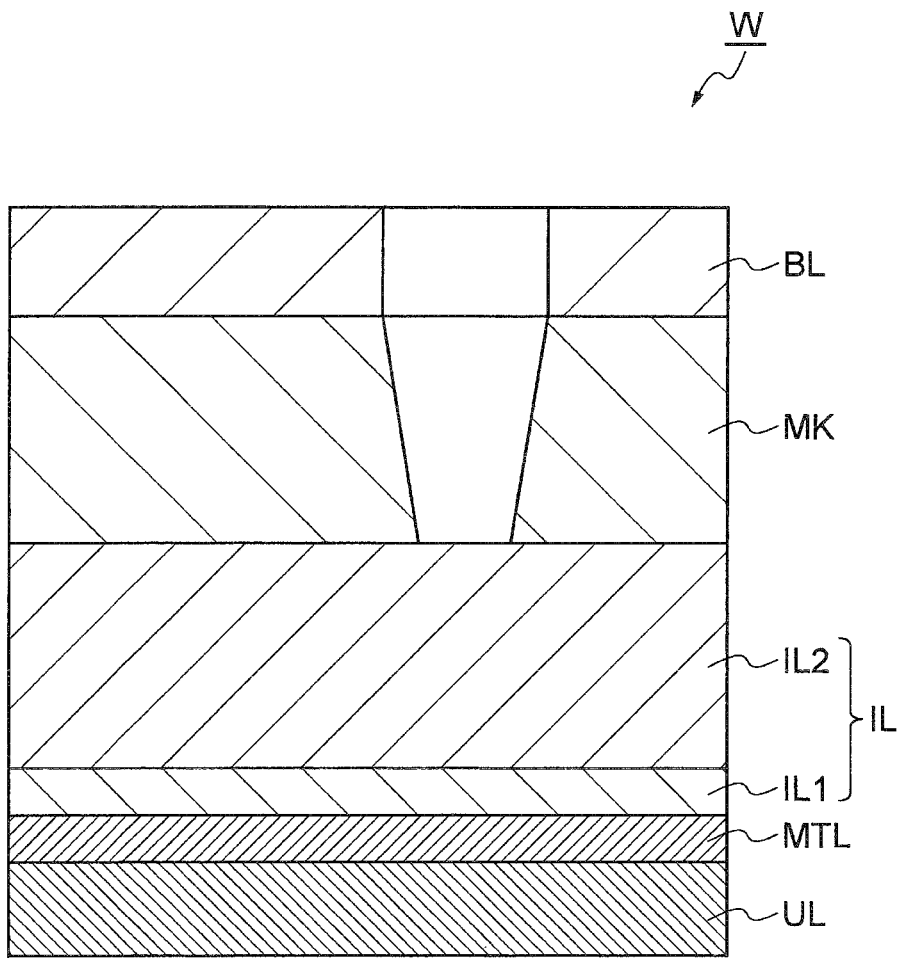
Figure 9:
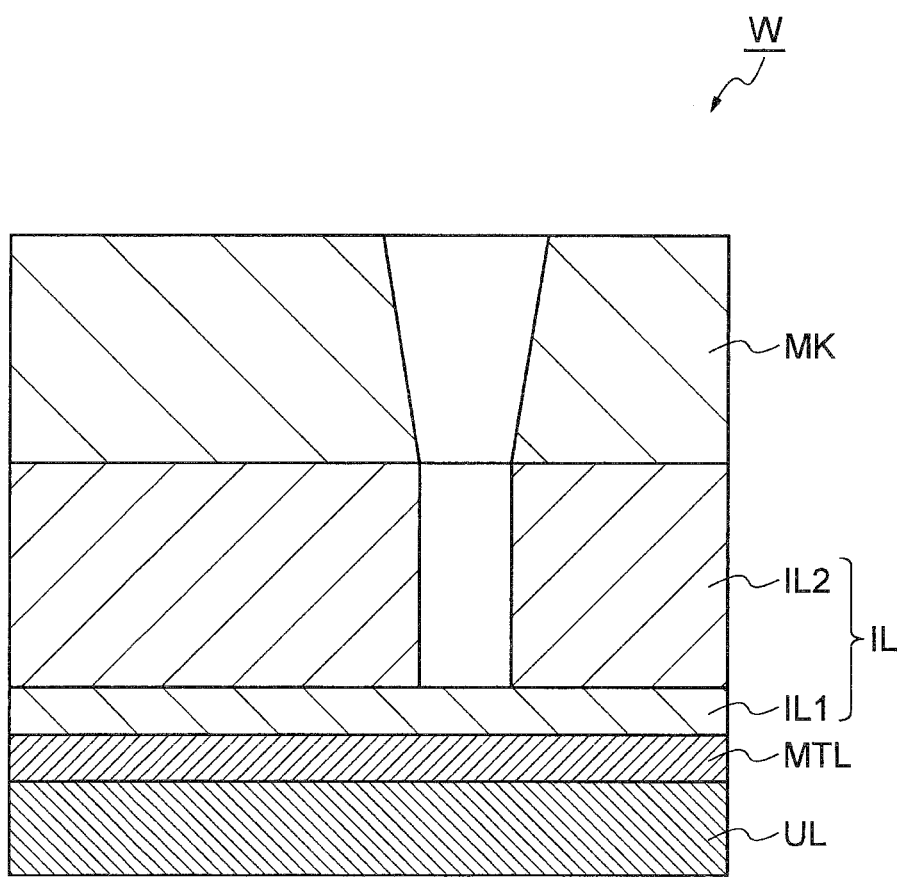

In the step ST31, the second layer IL2 is etched. In the case of using the plasma processing apparatus 10, in the step ST31, the target object W shown in FIG. 8 is mounted on the electrostatic chuck 20 of the stage 16 and held by the electrostatic chuck 20. In the step ST31, a gas for etching the second layer IL2 is supplied to the chamber 12c from one or more gas sources selected among the plurality of gas sources. In the step ST31, the gas supplied to the chamber 12c is, e.g., a mixture of fluorocarbon gas, $O_2$ gas, and a rare gas. Further, in the step ST31, a pressure in the chamber 12c is reduced by the gas exhaust unit 50. Moreover, in the step ST31, the first high frequency power from the first high frequency power supply 62 is supplied to the upper electrode 30, and the second high frequency power from the second high frequency power supply 64 is supplied to the lower electrode 18. In the step ST31, a plasma of the gas supplied to the chamber 12c is generated, and the second layer IL2 is etched by active species such as ions and/or radicals in the plasma. By executing the step ST31, an opening communicating with the opening of the mask MK is formed in the second layer IL2, as shown in FIG. 9.

Figure 10:
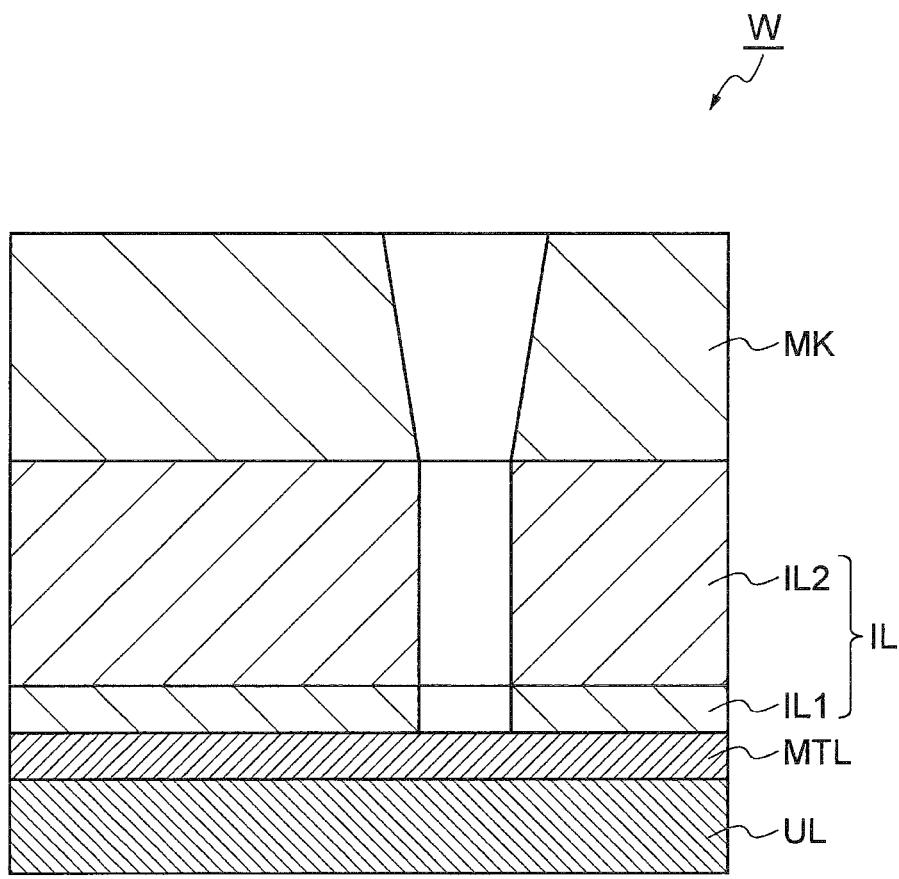

In the step ST32, the first layer IL1 is etched. In the case of using the plasma processing apparatus 10, in the step ST32, the target object W is mounted on the electrostatic chuck 20 of the stage 16 and held by the electrostatic chuck 20. In the step ST32, a gas for etching the first layer IL1 is supplied to the chamber 12c from one or more gas sources selected among the plurality of gas sources. In the step ST32, the gas supplied to the chamber 12c is, e.g., a mixture of hydrofluorocarbon gas and a rare gas. Further, in the step ST32, a pressure in the chamber 12c is reduced by the gas exhaust unit 50. Moreover, in the step ST32, the first high frequency power from the first high frequency power supply 62 is supplied to the upper electrode 30, and the second high frequency power from the second high frequency power supply 64 is supplied to the lower electrode 18. In the step ST32, a plasma of the gas supplied to the chamber 12c is generated, and the first layer IL1 is etched by active species such as ions and/or radicals in the plasma. By executing the step ST32, an opening continuous to the opening of the mask MK and the opening of the second layer IL2 is formed in the first layer IL1, as shown in FIG. 10. By executing the step ST3, the opening formed in the insulating film IL extends to the surface of the metal layer MTL. When the insulating film IL is etched, a residue containing fluorine is generated on the surface of the metal layer MTL.

Next, as shown in FIG. 1, a step ST4 of the method MT according to the embodiment is executed. In the step ST4, the mask MK of the target object W shown in FIG. 10 is removed. In the step ST4, plasma etching is performed to remove the mask MK. In the case of using the plasma processing apparatus 10, in the step ST4, the target object W shown in FIG. 10 is mounted on the electrostatic chuck 20 of the stage 16 and held by the electrostatic chuck 20. In the step ST4, a gas for etching the mask MK is supplied to the chamber 12c from one or more gas sources selected, among the plurality of gas sources. In the step ST4, the gas supplied to the chamber 12c is a gas containing nitrogen (N) and/or hydrogen (H), e.g., a mixture of $N_2$ gas and $H_2$ gas. Further, in the step ST4, a pressure in the chamber 12c is reduced by the gas exhaust unit 50. Further, in the step ST4, the first high frequency power from the first high frequency power supply 62 is supplied to the upper electrode 30. In the step ST4, the second high frequency power from the second high frequency power supply 64 may be supplied to the lower electrode 18. The gas supplied to the chamber 12c in the step ST4 may be a gas containing oxygen (O) such as $O_2$, CO, and $CO_2$.

Figure 11:
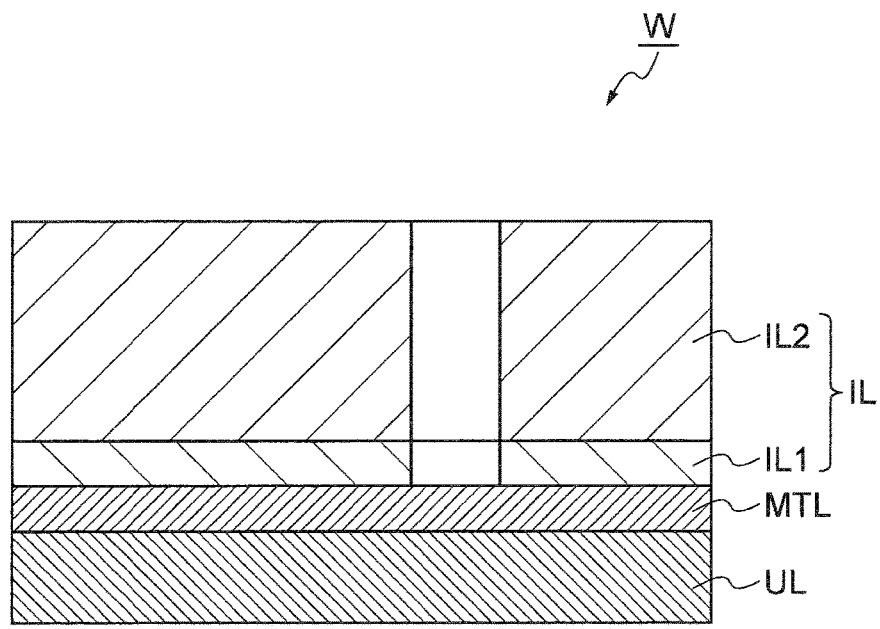

In the step ST4, a plasma of the gas supplied to the chamber 12c is generated, and the mask MK is etched by active species such as ions and/or radicals in the plasma. By executing the step ST4, the mask MK is removed as shown in FIG. 11.

In one embodiment, the method MT may further include a step ST5 between the step ST4 and a step ST6. In the step ST5, treatment is performed on the metal layer MTL of the target object W that has been subject to the step ST4. The treatment in the step ST5 is plasma treatment using a plasma of a gas containing, e.g., $N_2$ and $H_2$. In the case of using the plasma processing apparatus 10, in the step ST5, the target object W is mounted on the electrostatic chuck 20 of the stage 16 and held by the electrostatic chuck 20. In the step ST5, a gas (mixed gas) containing $N_2$ and $H_2$ is supplied from the plurality of gas sources to the chamber 12c. Further, in the step ST5, a pressure in the chamber 12c is reduced by the gas exhaust unit 50. Further, in the step ST5, the first high frequency power from the first high frequency power supply 62 may be supplied to the upper electrode 30, and the second high frequency power from the second high frequency power supply 64 may be supplied to the lower electrode 18. The gas used for the treatment in the step ST5 is not limited to the gas containing $N_2$ and $H_2$, and may be a gas containing hydrogen (H). The gas used for the treatment in the step ST5 may contain nitrogen (N) in addition to hydrogen (H). Further, the gas used for the treatment in the step ST5 may be a reduction gas.

In the step ST5, a plasma of the gas supplied to the chamber 12c is generated, and the surface of the metal layer MTL is processed by active species such as ions and/or radicals in the plasma. In other words, the amount of residue on the surface of the metal layer MTL is reduced. When the treatment gas in the step ST5 is a reduction gas, e.g., a gas containing hydrogen (H), even if the surface of the metal layer MTL is oxidized in the step ST3 or ST4 by the treatment, the surface of the metal layer MTL is reduced.

Next, the step ST6 of the method MT is executed. In the step ST6, as shown in FIG. 12, a barrier film BF is formed to cover the surface of the insulating film IL and the surface of the metal layer MTL exposed through the opening formed in the insulating film IL. The barrier film BF formed in the step ST6 is conformally formed on the surface of the insulating film IL and on the surface of the metal layer MTL exposed through the opening formed in the insulating film IL. In other words, the dependency of the film thickness of the barrier film BF on the formation position on the surface of the target object W is low. For example, the variation in the film thickness of the barrier film BF is ±10% or less with respect to an average film thickness of the barrier film BF. The film thickness of the barrier film BF may be less than ½ or ¼ of a width or a diameter of the opening formed in the insulating film IL. In one embodiment, the film thickness of the barrier film BF is 0.45 nm or more.

The barrier film BF may be a silicon-containing film or a metal oxide film. The silicon-containing film is, e.g., a silicon oxide film, a silicon nitride film, or a silicon carbide film. The metal oxide film is, e.g., an aluminum oxide film. The barrier film BF may be formed by a cyclic deposition method such as an atomic layer deposition method or a cyclic plasma enhanced CVD (Chemical Vapor Deposition) method.

In the case of using the atomic layer deposition method in the step ST6, the step ST6 includes steps ST61 to ST65 as shown in FIG. 6. In the step ST61, the precursor gas is supplied to the target object W accommodated in the chamber. In one embodiment, the precursor gas does not contain a halogen element. When the step ST61 is executed, the precursor is adsorbed on the surface of the target object W. Next, in a step ST62, the chamber is purged. Next, in a step ST63, plasma treatment is performed on the target object in the chamber. In the step ST63, the precursor adsorbed on the target object W reacts with ions and/or radicals in the plasma. Next, in a step ST64, it is determined whether or not a termination condition is satisfied. The termination condition is satisfied when the number of executions of the sequence including the steps ST61 and ST63 has reached a predetermined number. If the termination condition is not satisfied, the chamber is purged in the step ST65, and the process returns to the step ST61. On the other hand, if the termination condition is satisfied, the step ST6 is completed. As a result, the barrier film BF is formed. The step ST6 may not include the step ST62 and the step ST65.

When the barrier film BF is a silicon-containing film, a silicon-containing gas is used as the precursor gas in the step ST61. The silicon-containing gas used as the precursor gas is, e.g., the above-described first aminosilane-based gas or silicon alkoxide-based gas. When the barrier film BF is a metal oxide film, a metal-containing gas is used as the precursor gas in the step ST61. The metal-containing gas is, e.g., trimethylaluminum gas. When the barrier film BF is a silicon oxide film or a metal oxide film, an oxygen-containing gas is used in the plasma treatment in the step ST63. The oxygen-containing gas is, e.g., oxygen ($O_2$) gas, CO gas, or $CO_2$ gas. When the barrier film BF is a silicon nitride film, a nitrogen-containing gas (e.g., $NH_3$ gas) is used in the plasma treatment of the step ST63. When the barrier film BF is a silicon carbide film, a hydrocarbon gas (e.g., $CH_4$ gas, $O_2H_4$ gas, or $C_3H_8$ gas) is used in the plasma treatment of the step ST63.

In the case of using the atomic layer deposition method in the step ST6, it is possible to form a conformal film and also possible to form a film with few pinholes, compared to the case of using the chemical vapor deposition method (CVD). Therefore, a film formed by the atomic layer deposition method has an extremely low permeability. In other words, in the case of using the atomic layer deposition method, a barrier film having high barrier properties can be formed. Further, in the case of using the atomic layer deposition method, it is possible to form a film having high conformality and a high aspect ratio. Therefore, even if an opening dimension of the mask MK of the target object W is miniaturized, the barrier film BF can be formed on the surface of the metal layer MTL. Moreover, in the case of using the atomic layer deposition method, a film can be formed at a lower processing temperature, compared to the case of using the chemical vapor deposition method (CVD). Accordingly, it is possible to suppress the influence of the film formation process on the semiconductor device included in the target object W.

The target object W is maintained in a depressurized environment from the start of the step ST3 to the end of the step ST6. In one embodiment, the target object W is maintained in the same chamber from the start of the step ST3 to the end of the step ST6. For example, the target object W is maintained in the chamber 12c of the plasma processing apparatus 10 from the start of the step ST3 to the end of the step ST6. In other words, the steps ST3 and ST6 are executed by the same plasma processing apparatus 10.

Alternatively, the step ST6 may be executed by using a substrate processing apparatus different from the substrate processing apparatus used in the step ST3. However, the target object W is maintained in a depressurized environment from the start of the step ST3 to the end of the step ST6. For example, after the step ST3 or the steps ST3 to ST5 are executed by the plasma processing apparatus 10, the target object W may be transferred, before the start of the step ST6, to a film forming apparatus that is another process module of the processing system 110 via the transfer module 116.

The method MT may further include a step ST7 between the step ST6 and a step ST8. In the step ST7, the above-described second aminosilane-based gas is supplied to the target object W shown in FIG. 12. By executing the step ST7, a protective film PF of the second aminosilane-based gas is formed on the barrier film BF as shown in FIG. 13. The step ST8 may be executed by using the plasma processing apparatus 10. Alternatively, the step ST8 may be executed by using a substrate processing apparatus of the processing system 110 which is different from the plasma processing apparatus 10.

Next, the step ST8 of the method MT is executed. In the step ST8, the target object W shown in FIG. 13 (the target object shown in FIG. 12 when the step ST7 is not executed) is placed in the atmospheric environment. In the case of using the processing system 110, the target object W is transferred from the substrate processing apparatus used in the step ST7 (the substrate processing apparatus used in the step ST6 when the step ST7 is not executed) to the atmospheric environment via the transfer module 116, the load-lock module 141 or 142, and the loader module 112. The target object W is stored in the atmospheric environment until a step ST9 is executed.

Next, the step ST9 of the method MT is executed. In the step ST9, the barrier film BF is removed as shown in FIG. 14. When the step ST7 is executed, the protective film PF is removed together with the barrier film BF. In the step ST9, the barrier film BF is removed by isotropic etching. In one embodiment, the isotropic etching is wet etching. Solution used for wet etching includes hydrogen fluoride (HF) or ammonium fluoride ($NH_4F$). A wet cleaning apparatus 210 may be used for the wet etching.

In accordance with the method MT, the surface of the insulating film IL and the surface of the metal layer MTL are covered with the barrier film BF after the insulating film are etched in the step ST3 and before the target object W is placed in the atmospheric environment. Since the surface of the metal layer MTL is protected by the barrier film BF, corrosion of the metal layer MTL is suppressed even when the target object W is placed in the atmospheric environment. The barrier film BF is removed in the step ST9. When the variation in the film thickness of the barrier film BF is large, the insulating film IL is partially considerably etched at a portion covered with a thin film portion. The barrier film BF formed by the method MT is a conformally formed film, and thus is uniformly removed by isotropic etching in the step ST9. Accordingly, in accordance with the method MT, when the barrier film BF is removed, the partial considerable etching of the insulating film IL is suppressed.

In the step ST3 of one embodiment, a precursor gas that does not contain a halogen element is used. By using the precursor gas, damages on the surface of the metal layer MTL are suppressed.

In one embodiment, the method MT includes the step ST7. When a silicon oxide film is formed as the barrier film BF by using a first aminosilane-based gas as the precursor gas and oxidizing the precursor by oxygen plasma treatment, an OH group is generated on the surface of the barrier film BF. The surface of the barrier film BF is hydrophilic. Since the second aminosilane-based gas used in the step ST7 is an aminosilane-based gas having an alkylsilane group, a hydrophobic protective film PF is formed on the surface of the barrier film BF by executing the step ST7. Therefore, the surface of the target object W becomes hydrophobic by executing the step ST7 before the target object W is placed in the atmospheric environment. As a result, adsorption of moisture to the target object W in the atmospheric environment is suppressed.

In one embodiment, the film thickness of the barrier film BF is 0.45 nm or more. Due to the presence of the barrier film BF having such a film thickness, corrosion of the surface of the metal layer MTL is further suppressed.

Hereinafter, first to sixth test examples and a comparative example will be described. In the first to sixth tests, the steps ST1, ST2, ST3, ST4 and ST6 were performed on a target object having the structure shown in FIG. 2 by using the plasma processing apparatus 10 and, then, the step ST8 was executed. Thereafter, the step ST9 was executed by using the wet cleaning apparatus 210. The target object had a metal layer made of cobalt and an insulating film that is a silicon oxide film formed on the metal layer. The film thickness of the insulating film was 80 nm. In the step ST3, a plurality of openings, each having a diameter of 30 nm, was formed in the insulating film. In the step ST6, the atomic layer deposition method shown in FIG. 6 was used. In the step ST61 of each sequence including the steps ST61 and ST63, a pressure in the chamber 12c was set to 100 mTorr (13.33 Pa), and monosilane gas having one amino group including an organic group was supplied as the precursor gas at a flow rate of 50 sccm to the target object for 10 seconds. In the step ST63 of each sequence, a pressure in the chamber 12c was set to 200 mTorr (26.66 Pa), and CO gas was supplied at a flow rate of 300 sccm to the chamber 12c. Further, in the step ST63 of each sequence, a first high frequency power having a frequency of 10 kHz was supplied at 300 W to the upper electrode 30. The step ST63 of each sequence was executed for 5 seconds. The number of execution of the sequence in each of the first to the sixth test examples was 1 to 6, respectively. In the step ST8, the target object was placed in the atmospheric environment for 6 hours. Thereafter, in the step ST9, the barrier film was removed by using a solution containing hydrogen fluoride. In the comparative example, the same target object was processed under conditions different from those of the first to the sixth test examples in that the step ST6 was not executed.

SEM images (Top View) of the target objects in the first to sixth test examples and the comparative example were obtained. From the SEM image of each target object, a ratio of the number of openings through which a corroded metal surface is exposed to a total number of openings formed in the insulating film was obtained. The ratio obtained in the comparative example was 97.8%; the ratio obtained in the first test example was 31.6%; the ratio obtained in the second test example was 30.0%; and the ratio obtained in the third to sixth test examples were 0%. Therefore, it has been confirmed that even when the target object is placed in the atmospheric environment, the corrosion of the surface of the metal layer is suppressed by forming the barrier film after the etching of the insulating film. In the case of using the atomic layer deposition method, the film thickness of the silicon oxide film formed per sequence was 0.15 nm. As a consequence, it has been confirmed that even when the target object is placed in the atmospheric environment, the corrosion of the surface of the metal layer is considerably suppressed by the barrier film having a film thickness of 0.45 nm or more.

While various embodiments have been described, various modifications can be made without being limited to the above-described embodiment. For example, in the above description, the capacitive coupling type plasma processing apparatus 10 is used in the method MT. However, the plasma processing apparatus used in the method MT may be an inductively coupled plasma processing apparatus or a plasma processing apparatus for exciting a gas by a surface wave such as a microwave.

In the above description, the metal layer made of cobalt or copper is used as the conductive layer of the substrate to which the method MT is applied. However, the conductive layer of the substrate to which the method MT is applied is not limited thereto. The conductive layer may be a metal layer made of ruthenium (Ru) or nickel (Ni). Alternatively, the conductive layer may be a silicon-containing layer having conductivity. The silicon-containing layer is, e.g., a silicon layer, a polycrystalline silicon layer, a non-crystalline silicon layer, or a silicon germanium (SiGe) layer to which conductive impurities such as boron (B) or arsenic (As) are added.

While the present disclosure has been shown and described with respect to the embodiments, it will be understood by those skilled in the art that various changes and modifications may be made without departing from the scope of the present disclosure as defined in the following claims.

What is claimed is:

1. A method for processing a target object including a conductive layer and an insulating film formed on the conductive layer, the method comprising:
    etching the insulating film by plasma treatment of a fluorine-containing gas to form an opening in the insulating film;
    forming a barrier film to cover a surface of the insulating film and a surface of the conductive layer that is exposed through the opening formed in the insulating film;
    placing the target object having the barrier film in an atmospheric environment; and
    removing the barrier film from the target object by isotropically etching the barrier film,
    wherein the target object is maintained in a depressurized environment from start of said etching the insulating film to end of said forming the barrier film, and
    the barrier film is conformally formed on the surface of the insulating film and on the surface of the conductive layer exposed through the opening formed in the insulating film.

2. The method of claim 1, wherein the barrier film is formed by an atomic layer deposition method, and
    said forming the barrier film includes:
        supplying a precursor gas to the target object to adsorb the precursor on the surface of the target object; and
        performing plasma treatment on the precursor to form the barrier film from the precursor.

3. The method of claim 2, wherein the precursor gas contains no halogen element.

4. The method of claim 2, wherein the precursor gas is an aminosilane-based gas or a silicon alkoxide-based gas.

5. The method of claim 4, wherein in said performing the plasma treatment, plasma treatment using a plasma of an oxygen-containing gas is performed on the precursor.

6. The method of claim 5, further comprising, between said forming the barrier film and said placing the target object, supplying an aminosilane-based gas having an alkylsilane group to the target object.

7. The method of claim 1, wherein the barrier film is a silicon oxide film.

8. The method of claim 1, wherein the barrier film is a silicon nitride film or a silicon carbide film.

9. The method of claim 1, wherein the barrier film is a metal oxide film.

10. The method of claim 1, wherein the barrier film has a film thickness of 0.45 nm or more.

11. The method of claim 1, wherein a mask is provided on the insulating film,
    wherein in said etching the insulating film, a portion of the insulating film, which is exposed through the opening formed in the mask, is etched, and
    wherein the method further comprises, between said etching the insulating film and said forming the barrier film, removing the mask by plasma treatment.

12. The method of claim 11, further comprising, between said etching the insulating film and said forming the barrier film, performing treatment of the conductive layer by using a plasma of a gas containing hydrogen.

13. The method of claim 1, wherein in said removing the barrier film, the barrier film is removed by wet etching and solution used for the wet etching contains hydrogen fluoride or ammonium fluoride.

14. The method of claim 1, wherein the target object is maintained in the same chamber from the start of said etching the insulating film to the end of said forming the barrier film.

15. The method of claim 1, wherein the conductive layer is a metal layer or a silicon-containing conductive layer.

* * * * *